United States Patent [19]
Duley

[11] Patent Number: 5,459,671
[45] Date of Patent: Oct. 17, 1995

[54] PROGRAMMABLE BATTERY CONTROLLER

[75] Inventor: Ray S. Duley, Buda, Tex.

[73] Assignee: Advanced Micro Devices, Inc., Sunnyvale, Calif.

[21] Appl. No.: 19,858

[22] Filed: Feb. 19, 1993

[51] Int. Cl.⁶ ................................................. G08B 21/00
[52] U.S. Cl. .................... 364/483; 320/43; 320/48; 324/427; 340/636; 364/481; 364/550
[58] Field of Search ...................... 320/43, 48; 324/427, 324/431; 340/636; 364/481, 483, 550

[56] References Cited

U.S. PATENT DOCUMENTS

| | | | |
|---|---|---|---|
| 2,864,055 | 12/1958 | Kordesch et al. | 324/427 |
| 3,383,580 | 5/1968 | Wallace, Jr. | 320/48 |
| 3,617,850 | 11/1971 | Domshy | 320/48 X |
| 4,153,867 | 5/1979 | Jungfer et al. | 320/48 X |
| 4,949,046 | 8/1990 | Seyfang | 340/636 X |
| 5,057,383 | 10/1991 | Sokira | 429/92 |
| 5,284,719 | 2/1994 | Landau et al. | 324/427 X |
| 5,311,112 | 5/1994 | Creaco et al. | 320/48 X |
| 5,321,627 | 6/1994 | Reher | 364/483 |
| 5,325,041 | 6/1994 | Briggs | 320/48 X |

*Primary Examiner*—Edward R. Cosimano
*Attorney, Agent, or Firm*—Kevin L. Daffer

[57] ABSTRACT

A programmable battery controller is provided for controlling and monitoring charge level, temperature, discharge and recharge of a rechargeable battery. The controller utilizes a host system microprocessor, a microcontroller, a charge gauge integrated circuit, and a display to provide continually updated battery status information. Further, the apparatus allows a user to configure battery monitoring parameters in order to adjust warning signals and enable battery discharge cycles.

14 Claims, 8 Drawing Sheets

| | | 22 |
|---|---|---|
| | Battery Control and Status | |
| 24 → | Remaining Battery Charge | ▮▮▮▮▮▮▮ (Bar Guage) |
| | | 0 10 20 30 40 50 60 70 80 90 100 (%) |
| 28 → | Low Battery Level Setting | [10], 20, 30 (%) |
| | Battery Status: | [Status/Warning line #1]* |
| | | [Status/Warning line #2]* |
| | | [Status/Warning line #3]* |
| 30 → | Maintenance Discharge Requested | (Blink) |
| | Discharge Cycle Permitted? | [No], Yes (AC Wall Adapter Required) (Blink) |
| 32 → | Low Battery Audio Warning | Disabled, [Enabled] |
| 26 → | Battery Temp. Bar (Optional): | ▮▮▮▮▮▮▮ (Bar Guage) |
| | | [-20C, -10, 0, 10, 20, 30, 40, 50, 60, 70, 80] (°C) |

FIG. 2

PROGRAMMABLE BATTERY CONTROLLER

BACKGROUND OF THE INVENTION

1. Field of the Invention

This invention relates to a programmable battery controller and more particularly to a programmable apparatus, system and method for more accurately controlling and/or monitoring battery charge. The programmable battery controller includes a rechargeable battery, a host system microprocessor, a microcontroller, a charge gauge integrated circuit, and a display, which are programmed to allow a portable computer user to set battery monitoring parameters.

2. Background of the Relevant Art

Battery monitoring systems are commonly used to notify a portable computer user when a rechargeable battery needs recharging. Conventional battery monitoring systems often implement a software program that relies on a computer's hardware configuration and the power needed to run the components and peripherals. The software then monitors the usage of the components and peripherals to approximate the battery's drain rate and the remaining charge on the battery.

Such software approximates the remaining battery charge based on the power specifications of components and peripherals. Based upon power specifications for particular components and the chosen battery discharge rate, the software then calculates approximately where the battery's charge level currently resides. Such approximations fail to take into account the variances of actual components. In addition, the computer user must adapt the software whenever a portable computer is reconfigured with different parts or new batteries. Software programs necessary to achieve many of these functions are often referred to as terminate and stay resident (TSR) programs. TSR programs typically require multiple host computer interface operations which can, and often do, cause the host computer to lock up periodically or cause the program not to be run.

In an effort to overcome deficiencies of software approximation programs, more recent developments in charge monitoring devices have taken place. One such device monitors the voltage level of the rechargeable battery. An analog-to-digital converter may be employed to monitor the battery voltage throughout its operation. However, when a battery discharges during use, the voltage output generally reacts non-linearly. The non-linear discharge in the battery voltage may create false signals that a battery needs recharging when the battery, in fact, still contains sufficient charge. Alternatively, nonlinear discharge shows the battery as completely discharged even though adequate charge still remains. The false signals are read by the analog-to-digital converter which then outputs incorrect signals to the controller, and the controller prematurely charges the battery, thereby lessening the battery's capacity and lifetime.

Typical battery voltage monitors often cannot and do not indicate when a full discharge has occurred and that recharge is now needed to maintain optimal battery performance. Nickel cadmium batteries are commonly used in portable computers. However, nickel cadmium batteries are susceptible to the memory effect—they might not recharge fully if they're not first completely discharged. For example, if a battery is repeatedly recharged before reaching a low battery level, a three-hour battery may only last for one hour. A full battery discharge helps eliminate the memory effect. Conventional charge monitoring devices often do not store non-linear discharge information. As a result the computer user must know of battery characteristics, and monitor battery usage to determine when a discharge is necessary and how long discharge is needed in order to prolong battery life.

Some conventional monitoring devices use discrete components to measure the actual current drain on a battery. However such systems are bulky, do not provide flexibility, and do not exhibit accuracy. Battery discharge rates vary according to the batteries chemical composition, temperature, storage time, age of the battery, and load. Computer users find desirable battery monitoring systems which are not bulky and which can (i) determine when a discharge cycle is needed, (ii) determine an optimal discharge period, and (iii) perform the discharge and recharge cycles automatically under varying loads and operating temperatures.

Other conventional monitoring devices place significant portions of the monitoring circuitry external to the battery operated device. The battery operated device stores battery status data until an external circuit is connected and evaluates the battery's status. Unfortunately such systems do not provide real time battery status updates. Connections must occur before battery status can be read. Further, such systems require a user of a portable device to carry with him or her additional hardware circuitry and to connect that circuitry periodically to the battery operating device. Such constraints are cumbersome and make battery management and evaluation difficult.

SUMMARY OF THE INVENTION

The problems outlined above are in large measure solved by the method and device of the present invention. That is, the programmable battery controller hereof provides a small, accurate, real time, and flexible low power battery monitoring system that allows user input. This invention can accurately monitor temperature and charge characteristics as well as battery output variations over the life of the battery. Adjusting to battery output variations and executing full discharge cycles, the present invention provides a controlling and monitoring system which can prolong battery life and enhance battery performance. Enhanced battery performance achieves more reliable battery operation, provides longer battery life from each battery charge, and allows smaller batteries to achieve the same system tasks. Accordingly, the present battery monitoring system hereof can be used in any programmable portable device, and allows for the design of smaller and lighter portable devices such as, for example, portable computers (i.e., notebooks, subnotebooks, laptops and/or palmtops) or any other host portable device having microprocessor-based operation.

Furthermore, a programmable battery charger offers flexibility for future battery types and characteristics. Advances in rechargeable nickel cadmium (NICAD), lead-acid, nickel metal hydride (NMH), lithium, and carbon batteries provide a variety of new operating characteristics. Operating characteristics can include variations in charge current, storage duration, temperature degradation, battery age, and battery discharge rates. The programmable nature of this invention permits the design of battery monitoring parameters suitable to a particular battery's operating characteristics.

A further feature of the present invention is to allow a user to selectively change parameters. A user can input monitoring parameters to adapt to special circumstances, such as, for example, delaying a discharge cycle until the user manually initiates the discharge. Otherwise, once the parameters are set, discharge cycles can begin automatically without user interface. Also, the full programmability of the battery controller allows the presentation of battery charge data and battery status on future display devices and on present display devices such as on computer monitor cathode ray tubes (CRTs), icon displays (e.g., liquid crystal displays (LCDs), and light emitting diode (LED) indicators.

The present invention further allows use of preset battery monitoring parameters. Thus, a user need not have any battery expertise or special battery knowledge. Battery monitoring and maintenance is transparent to the user. Thus, the user need not know the special characteristics of a battery nor need he or she know when discharge and recharge cycles are necessary. The present device automatically monitors and controls the battery charge based on the type of battery used, the temperature of the battery, the age of the battery, and the battery charge capacity.

Even still further, the invention allows the use of existing hardware on a portable computer system (or host system). Most portable computers have a keyboard, keyboard interface, and keyboard microcontroller to manage keyboard input. The software routines of the present invention use the pre-existing keyboard microcontroller hardware to help monitor battery parameters. Thus, the use of additional circuitry is not required by the host system. A reduction in battery monitoring hardware lessens space, weight and power requirements. In portable devices, weight and battery life provide competitive product advantages. Moreover, a reduction in battery monitoring hardware lessens manufacturing and maintenance costs. Other advantages of the present invention allow adaptation to other portable, battery driven host devices beyond keyboard entry microcontrollers. Such devices include microcontroller-based units which directly control peripherals such as pen-based input devices, mouse-based input devices, touch input devices, or scanning devices.

Broadly speaking, the present invention contemplates a programmable battery controller which uses hardware to monitor the actual charge drain and temperature of a rechargeable battery. The device includes a system microprocessor, a computer display, a keyboard interface gate array, a keyboard microcontroller, a charge gauge integrated circuit, and an icon display. Charge gauge software allows the keyboard microcontroller to monitor both the keyboard and the battery while also driving control signals to the host computer and battery charger. Further, the controller or charge gauging software allows a user to configure parameters to meet system needs. The battery controller system automatically determines when rechargeable battery discharge and charge cycles are needed. The charge controller system then notifies the user that a discharge is necessary to obtain maximum battery life. If enabled, the battery controller system will execute discharge and charge cycles automatically without interfering with the user's current operation/application.

The present invention also supports two display devices to transmit the battery status information to the computer user. One display device is a small LCD readout mounted on or near the computer keyboard called the icon display. The icon display shows the battery charge level as a fuel or charge meter with icons between full and empty. A battery icon, and ten other charge meter icons range from empty to full in 10% charge steps. Thus, if six of the charge meter icons are displayed, then 60% of battery charge remains. The controller system also has a capacity for, and can support, sixteen charge meter icons in order to display fractions of capacity similar to an automobile fuel guage (e.g., ¼, ½, ¾, etc.).

The second display device is a conventional computer display. The charge gauge software presents the battery temperature, charge status, and user configured parameters in a menu format. The computer user presses a combination of keys (e.g. Control-alt-P) on the computer keyboard to bring up the power control menu. Once in this menu, the computer user can select options and obtain battery status information.

The present invention also contemplates a method for monitoring a computer battery which includes such a battery charge gauge system. In the method of monitoring the computer battery, charge gauge software follows preset battery monitoring parameters. This allows the user to interact with the computer user to alter the battery monitoring parameters as desired. The battery monitoring parameters include items such as the low level battery threshold, battery warning messages, discharge cycle enable, and low battery audio warnings. Based on the battery monitoring parameters, the charge gauge software continuously updates battery data such as charge levels and battery pack internal temperature.

BRIEF DESCRIPTION OF THE DRAWINGS

Other objects and advantages of the invention will become apparent upon reading the following detailed description and upon reference to accompanying drawings in which:

FIG. 2 is a user interactive power control menu configured upon a computer display according to the present invention;

Figure 1:
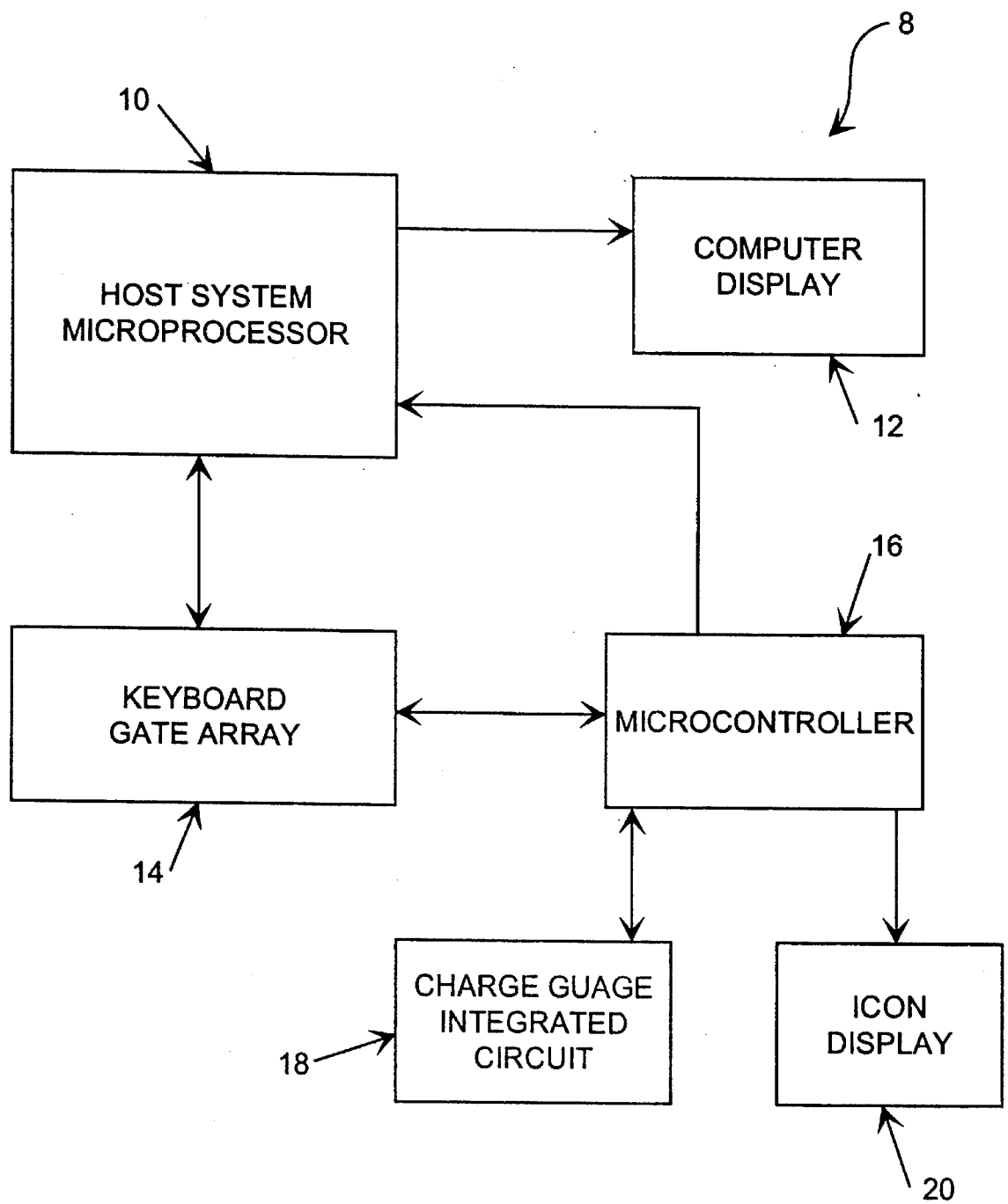
FIG. 1 is a block diagram of a programmable battery controller according to the present invention.

While the invention is susceptible to various modifications and alternative forms, specific embodiments thereof are shown by way of example in the drawings and will herein be described in detail. It should be understood, however, that the drawings and description thereto are not intended to limit the invention to the particular forms disclosed, but on the contrary, the intention is to cover all modifications, equivalents and alternatives falling within the spirit and scope of the present invention as defined by the appended claims.

DETAILED DESCRIPTION OF THE INVENTION

Turning now to the drawings, FIG. 1 illustrates a block diagram of a programmable battery controller 8 or battery charge gauge system. The battery controller or charge gauge system 8 includes a system microprocessor 10, a computer monitor or display 12, a keyboard gate array 14, a microcontroller 16, a charge gauge integrated circuit 18, and an icon display 20. System microprocessor 10 runs charge gauge software necessary to interface to microcontroller 16 via keyboard gate array 14.

Software placed within microcontroller 16 monitors the charge gauge integrated circuit 18 and obtains battery data such as charge, temperature, and battery status information. Microcontroller 16 communicates the battery information to the system microprocessor 10 which displays the battery charge, temperature and battery status information to the computer display 12. In addition to, or in lieu of, the computer display 12, an icon display 20 may be used to indicate battery charge status. Icon display 20 includes a small liquid crystal display (LCD) readout mounted on or near the computer keyboard. LCD readout is active independent of computer display 12.

System microprocessor 10 acts as a central processing unit that executes an operating system. The operating system is an integrated collection of supervisory programs and subroutines that control the execution of the computer programs and performs special system functions. One such special function of the operating system is to control the basic input and output of the charge gauge system. The basic input and output or "BIOS" routines work closely with the hardware to support the transfer of information between elements of the system. The BIOS routines also communicate with microcontroller 16, by reading data from and writing data to the internal registers on the microcontroller 16. Microcontroller 16 communicates with the BIOS by asserting an interrupt. The microcontroller 16 executes its own programs and only interrupts the system microprocessor 10 when some action needs to be taken. During a microcontroller interrupt, the BIOS will stop the present program running on the system microprocessor 10 and check the status of the microcontroller 16 by reading data from the microcontroller's internal registers via keyboard gate array 14. Depending on the status of the microcontroller's internal registers, the BIOS will warn the computer user about a low battery charge level, when a discharge cycle request is made, or when a battery is replaced.

The power management BIOS routine incorporates charge gauge software and a power control menu 22, as shown in FIG. 2. Power control menu 22 allows a user to define the power monitoring characteristics. A user enters the power control menu 22 by pressing a series of keys on the keyboard. In the preferred exemplary embodiment the user presses Cntl-Alt-P on the computer keyboard and the power control menu 22 is then displayed on the computer display 12. The user can then interacts with and/or control the battery by responding, via the keyboard, to the menu 22 prompts.

The power control menu 22 displays battery data such as the current battery charge 24 remaining on the battery and the current battery temperature 26. Battery charge 24 and temperature 26 are expressed as a bar gauge indicator as shown. Power control menu 22 also displays battery monitor parameters such as low battery setting 28, the discharge cycle 30, and low battery audio warning 32. "Maintenance discharge requested" and "discharge cycle permitted" are preferrably displayed only when charge guage circuit 18 has requested a discharge cycle. The user defines the battery monitoring parameters by altering the various settings. The charge gauge software will utilize the battery monitoring parameters to monitor the computer's battery. For example, the low battery level setting defines the charge level for a low battery warning. If the user changes the low battery level setting 28, from 10% to 20%, the computer will warn the user to recharge the battery when 20% of the charge remains. Likewise, the user can enable automatic discharge cycle by changing settings 30 from "no" to "yes". Automatic discharge will occur periodically without user interaction. Low battery audio warning 32 can be enabled to audibly warn the user of a low battery.

Host system microprocessor 10 is commonly configured by those skilled in this art to run a standard system BIOS providing all standard BIOS routines including charge gauge software routines. System microprocessor 10 may include any AT/XT IBM®-compatible microprocessor such as a 386, 486 or derivative microprocessor architecture manufactured by, e.g., Intel Corp. of Santa Clara, Calif., or Advanced Micro Devices, Inc. of Sunnyvale, Calif. Microprocessor 10 preferably operates at or near 3.3 V. It is important to note, however, that other microprocessors and operating voltage levels may be used provided they are capable of running the BIOS routines herein described.

BIOS running on system microprocessor 10 communicates to the microcontroller 16 via the keyboard gate array 14. A bidirectional bus connects host system 10 to microcontroller 16 via a universal peripheral interface controller. A suitable peripheral controller can be obtained from Intel Corp. of Santa Clara, Calif., part no. 8742. Peripheral controller (not shown) allows the user to control a peripheral such as microcontroller 16. Peripheral controller includes internal status and data registers along with and ROM, RAM, I/O timer and clock control to allow the controller to read/write information between host microprocessor 10 and microcontroller 16 as shown.

Keyboard gate array emulates the keyboard controller commonly used in AT/XT and/or PS/2 compatible personal computers. A suitable keyboard gate array 14 may be obtained from Western Digital Corporation of Irvine, Calif., part no. WD7635LV. However, it is understood that the battery charge gauge system may employ other circuits to emulate the keyboard controller. The WD7635LV keyboard gate array 14 and microcontroller 16 provides keyboard compatibility, reduces power consumption, increases battery life, and minimizes chip count. A suitable microcontroller 16 can be obtained from Hitachi Corp., San Jose, Calif., part no. H8/330 keyboard controller. It is important to note that gate array 14 and microcontroller 16 can be combined on a single monolithic chip. The single chip can be obtained from Hitachi Corp. of San Jose, Calif., part no. H8/3332.

It is understood that, in general, a microcontroller operates similar to a microprocessor in that a microcontroller has a central processor, memory and input/output ports. However, microcontroller design enhances real-time, hardware-intensive applications such as keyboard encoding. As described above, in the preferred exemplary embodiment, microcontroller 16 may be obtained from Hitachi Corp., part no. H8/330 keyboard controller; however, other general purpose microcontrollers with adequate internal registers and communication ports may also be used. Portions of the charge gauge software reside in the firmware of microcontroller 16. The programmability of microcontroller 16 firmware reduces chip count and provides flexibility in adaptation to future configurations.

Charge gauge integrated circuit 18 monitors the battery charge level via a battery charge sensor. The battery charge sensor consists of a sense resistor 46c of common design connected to the battery's negative battery terminal and ground to determine charge and discharge current activity (see FIG. 5). Charge gauge integrated circuit 18 not only monitors status of sense resistor 46c but also monitors battery temperature via a thermistor 45 connected to battery 46. The thermistor placed into the battery pack includes a thermal resistor of common design that changes resistance in relation to the temperature. Charge gauge integrated circuit 18 is preferably implemented using part no. BQ2010 integrated circuit manufactured by Benchmarq Microelectronics, Dallas, Tex. However, the battery charge gauge system may use other circuits with similar measurement capabilities. The BQ2010 combines battery-monitoring, management, discharging and charging functions on one integrated circuit. The BQ2010 chip gauges battery charge consumption and works with the following rechargeable batteries: NICAD, NMH, lead-acid, lithium, and carbon batteries.

Figure 3:
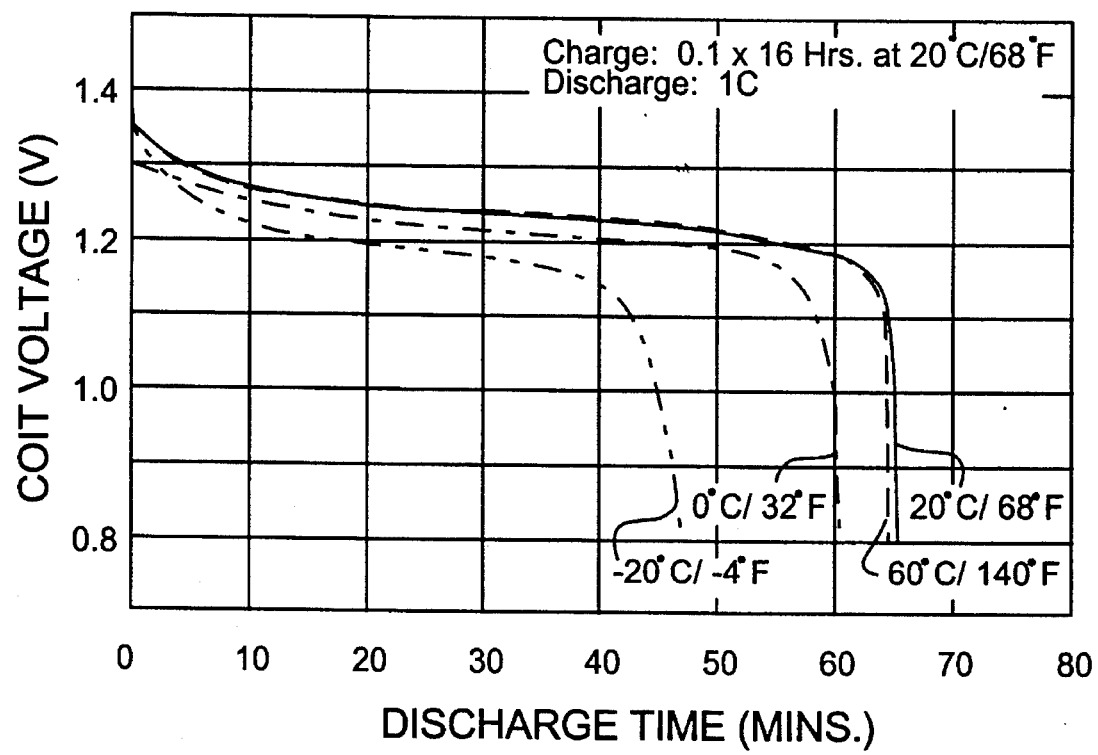
FIG. 3 is a graph of battery voltage capacity versus battery discharge time at various temperatures according to the present invention.

The capability of reporting on remaining battery charge is especially important with all rechargeable batteries such as nickel cadmium batteries. A nickel cadmium battery's performance varies with temperature and depletes rapidly toward the end of its charge cycle, as shown in FIG. 3. The BQ2010 monitors battery temperature and charge cycle to improve performance. The BQ2010 adapts to battery temperature, rate of charge, rate of discharge, and self-discharge to provide meaningful charge information (i.e., more accurate and not merely approximated charge information) of various battery types across a wide range of operating conditions. As shown in FIG. 3, charge and discharge time are dependent upon temperature. Therefore, it is imperative that operating temperature be monitored in order to ascertain proper charge and discharge rates.

Figure 4:
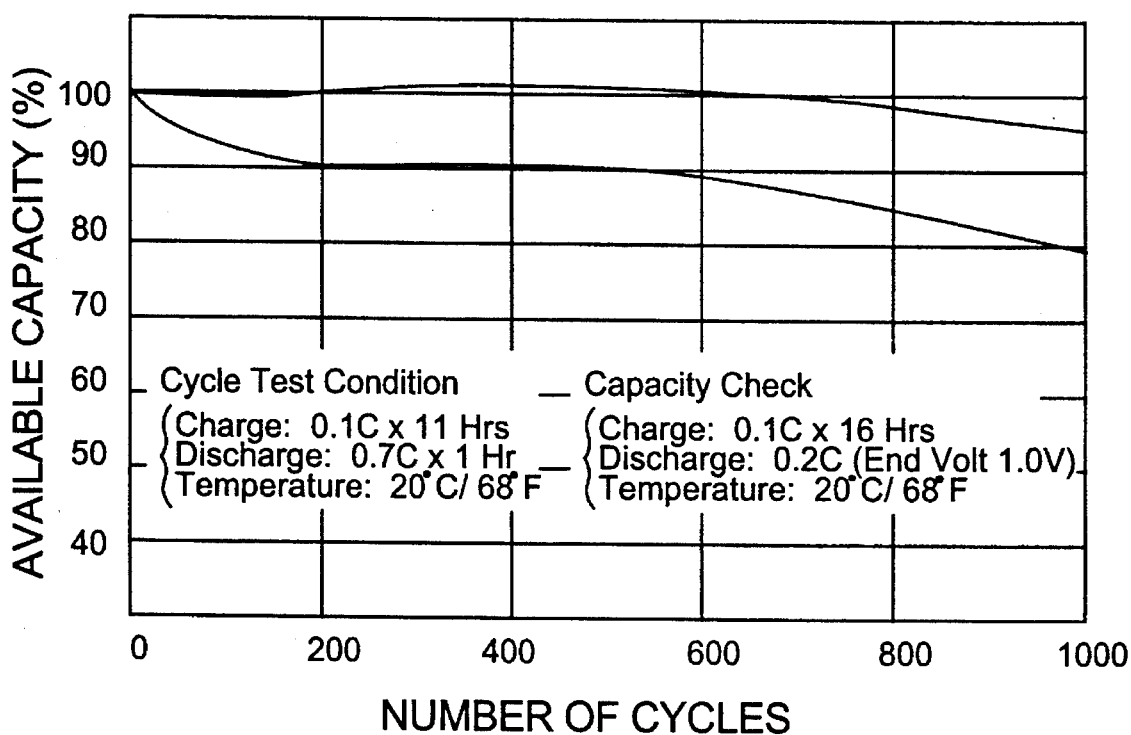
FIG. 4 is a graph of battery charge capacity verses battery charge cycles during the life of a battery according to the present invention.

A rechargeable battery slowly degrades over a period of time after which it has undergone multiple discharge and recharge cycles. Over the life of the battery, available charge capacity of a nickel cadmium battery declines as shown in FIG. 4. Circuit 18 recalibrates battery charge capacity in the course of a discharge cycle taking into account the relative age of the battery. Thereafter circuit 18 uses the recalibration values to provide accurate charge levels throughout the life of the battery. Circuit 18 uses the request to discharge in order to recalibrate both the fully discharge value and the fully charged value. This allows circuit 18 to accurately compute the charge and battery conditions. Recalibration of the battery is needed due to composition changes and temperature fluctuations within the battery material over the lifetime of the battery. Battery life, temperature, number of charge/discharge cycles all vary as a function of time, thereby necessitating periodic recalibration. It is therefore important to monitor the battery's relative age or charge capacity in order to accurately determine proper discharge and/or charge rate and cycle time.

Figure 5:
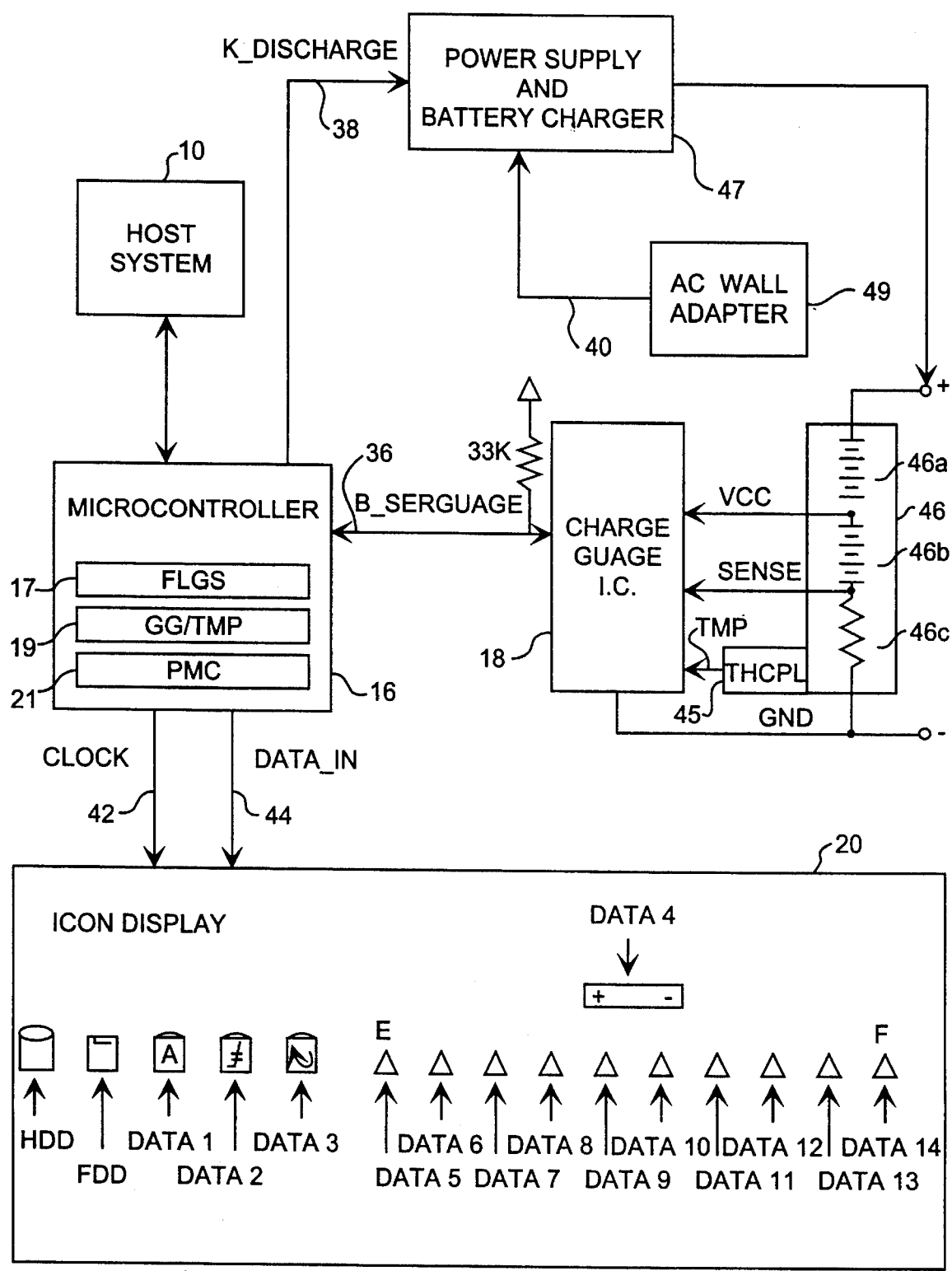
FIG. 5 is a block diagram of a microcontroller, charge gauge circuit and icon display according to the present invention.

Microcontroller 16 communicates with the charge gauge integrated circuit 18 with a variety of signals as shown in FIG. 5. The microcontroller 16 initiates all the serial communications to and from the charge gauge integrated circuit 18 by enabling Break signal via B_Sergauge signal 36. Break signal is driven onto B_Sergauge by protocol described below. The microcontroller 16 and charge gauge integrated circuit 18 transfer data on the bidirectional serial line via B-Sergauge signal 36. The bidirectional serial line B_Sergauge signal 36 allows the microcontroller 16 to read data from and write data to the charge gauge integrated circuit 18. The K_Discharge signal 38 allows the charge gauge integrated circuit 18 to fully discharge a battery before recharging. Sergauge signal is sent through the bidirectional data in/out pin of charge gauge circuit 18. Break signal is driven on the same line as sergauge data in/out, and K_discharge signal is driven by microcontroller 16 to the power supply in order to turn off AC wall adapter charge circuit.

To read information, microcontroller 16 sends the following command/address codes to the charge gauge integrated circuit 18 via the bidirectional serial line B_Sergauge signal 36.

| Hex Code | Register Name | Description |
| --- | --- | --- |
| 01h | FLGS1 | Flag information |
| 02h | GG/TMP | Charge gauge battery and temperature information |

In response to the address hex code 01h, charge gauge integrated circuit 18 will transmit the following FLGS byte back to the microcontroller 16. The FLGS byte consists of:

| Bit Number | Name of Bit | Description |
| --- | --- | --- |
| 0 | EDVF | Final very low battery flag |
| 1 | EDV1 | First very low battery flag |
| 2 | n/a | |
| 3 | n/a | |
| 4 | CI | Capacity inaccurate flag |
| 5 | BRM | Battery removed flag |
| 6 | BRP | Battery replaced flag |
| 7 | CHG | Charging flag |

In response to the address hex code 02h, charge gauge integrated circuit 18 will transmit the following GG/TMP byte back to the microcontroller 16. The GG/TMP byte consists of:

| Bit Number | Name of Bit | Description |
| --- | --- | --- |
| 3–0 | GG | Charge gauge available in charge steps from 0 to 100% in 10% steps. |
| 7–4 | TEMP | Temperature of battery from -20° C. to 80° C. in 10° C. steps. |

Bits 3-0 of the GG/TMP register contains the battery charge level as a percentage of full power. The GG/TMP register uses bits 3-0 to express binary numbers that represent the ten charge steps from 0 to 100%. Bits 7-4 of the GG/TMP register contains the battery temperature in degrees C. The GG/TMP register uses bits 7-4 to express binary numbers that represent the 10° C. steps between negative 20° C. and positive 70° C.

FLGS byte is written to and read from FLGS register 17 contained within microcontroller 16. Likewise, GG/TMP is written to and read from GG/TMP register 19 contained within microcontroller 16. Yet another register, denoted as PMC register 21, is contained within microcontroller 16. PMC register is a general purpose read/write register used by the BIOS to support power management functions in microcontroller 16. PMC register is written to and from the host system 10 BIOS and generally contains the firmware of microcontroller 16. The bit assignments of PMC register 21 are as follows:

| Bit Number | Name of Bit | Description |
| --- | --- | --- |
| 0 | DISCHG | If set to logic 1, then microcontroller 18 will drive port P97 to logic 1. If set to logic 0, then microcontroller 18 will drive port P97 to K_DISCHARGE. |
| 1 | SPKREN | Speaker enable 32 is in power control menu 22, microcontroller 18 port P46 enable. |
| 2 | LB30 | If set to logic 1, then, user has |

-continued

| Bit Number | Name of Bit | Description |
|---|---|---|
| 3 | LB20 | selected low battery level setting 28 to 30% from control menu 22. If set to logic 1, then user has selected low battery level setting 28 to 20% from control menu 22. |
| 4 | LB10 | If set to logic 1, then user has selected low battery level setting 28 to 10% from control menu 22. |
| 5 | RST-H8INT | If microcontroller 16 sets this bit to logic 1 and drives port P93 (H8INT) to logic 1, then the host bios resets this bit by writing logic 0 which, in turn, clears the H8INT to logic 0. |
| 6 | Reserved | |
| 7 | Reserved | |

As described above, microcontroller 16 places the FLGS, GG/TMP, and PMC information into internal registers 17, 19 and 21, respectively. The microcontroller 16 will preferably update its internal registers by reading from the charge gauge integrated circuit 18 every one minute and writing the charge data to icon display 20. If the battery falls below the low battery setting, microcontroller 16 will update the internal registers every 0.5 minute and write charging information to ICON display 20. The low battery setting is defined by the user as prompted in power control menu 22. For example, if a user sets the low battery setting 28 at twenty percent of total charge, microcontroller 16 will read the battery data from the charge gauge integrated circuit 18 every minute until the battery level drops below twenty percent of total charge. Once the battery drops below twenty percent, microcontroller 16 will beep the speaker and then update the battery information every 0.5 minute. Although the preferred invention updates the battery data on one minute and 0.5 minute intervals, the programmable nature of the microcontroller allows a wide range of potential time intervals. For example, the user could set low battery to 30% allowing the speaker to beep and the charge gauge would be updated every 0.5 minute. The host computer 10 is not involved with updating microcontroller 18 until microcontroller 18 detects a fault condition from the FLGS bits. If the host detects a fault, the microcontroller then drives the interrupt line, H8INT, to interrupt host system 10 and obtain its attention. Prior art control methodologies often requires the host computer to update charge gauge icons which the present invention does not require. Periodic involvement of the host computer can cause program lockup of the host application. The present invention does not involve the host until a FLGS bit occurs and therefore the host computer 10 runs applications without having to slow down or possibly lock up.

In addition to, or in lieu of computer display control menu, microcontroller 16 may display current status information on icon display 20. Icon display 20 is an LCD panel which is approximately 10 mm wide and 74 mm long. Icon display 20 is mounted on or near the keyboard. A CMOS LCD driver chip controls the display of the fourteen data segments on the icon display 20. A suitable CMOS LCD driver chip can be obtained from Microchip Technologies, Inc. of Chandler, Ariz., as part no. AY0438-I.

Microcontroller 16 communicates with the CMOS LCD driver chip via a Clock signal 42 and a Data_in signal 44. Data_in signal 44 and Clock signal 42 are pin-out designated leads defined on the CMOS LCD driver chip. The first two data segments of icon display 20 depict the status of the hard disk drive (HDD), and the floppy disk drive (FDD).

These two segments are driven from hardware control. The next three data segments display the status of the keyboard: caps lock (A), num lock (#), and scroll lock (curved arrow). The next eleven data segments represent the battery icon and ten fuel or charge meter icons which display the battery charge status. The charge meter icons range from empty to full in 10% charge steps. Thus, if six of the steps are displayed then 60% of battery charge remains. The data bit assignments are as follows:

| Data Bit ICON | LCD Indicator Functions |
|---|---|
| Data1 | Caps Lock |
| Data2 | Num Lock |
| Data3 | Scroll Lock |
| Data4 | Battery Icon |
| Data5 (Empty) | Charge Gauge (>0%) |
| Data6 | Charge Gauge (>10%) |
| Data7 | Charge Gauge (>20%) |
| Data8 | Charge Gauge (>30%) |
| Data9 | Charge Gauge (>40%) |
| Data10 | Charge Gauge (>50%) |
| Data11 | Charge Gauge (>60%) |
| Data12 | Charge Gauge (>70%) |
| Data13 | Charge Gauge (>80%) |
| Data14 (Full) | Charge Gauge (>90%) |

Thus, a computer user can quickly see the status of various peripherals and how much battery charge exists by looking at the charge gauge on icon display 20.

Power across power line 40 allow microcontroller 16 to fully charge while signal K_Discharge 38 allow microcontroller 16 to fully discharge, respectively, battery pack 46. Complete discharge (e.g., 1.0 volt/cell for NICAD batteries) is periodically achieved in order to subsequently allow optimal recharging. If a computer's NICAD battery is repeatedly recharged before full discharge, the NICAD battery eventually loses its capacity to fully recharge. For example, if a battery is repeatedly recharged before reaching a low battery level, a three-hour battery may only last for one hour. A full discharge makes it possible to recharge a battery to nearly its original charge retention capacity.

When the microcontroller 16 obtains and stores battery data from the charge gauge integrated circuit 18 it will obtain the CI flag from the FLGS byte. An asserted CI flag notifies the microcontroller 16 to request a battery discharge cycle. If the charge gauge integrated circuit 18 asserts the CI flag, the microcontroller 16 will issue an interrupt signal to notify the BIOS of the need for a discharge cycle. The BIOS will check PMC register 21 and then will write to power control menu 22 that a discharge cycle is recommended and microcontroller 16 will blink the active battery icons. The user is given the option to disable a discharge cycle 30 in the power control menu 22. If the computer user has configured the power control menu 22 to allow a discharge, the BIOS will proceed with a discharge cycle. There are times when the computer user will not have time for a discharge cycle. Thus, if the computer user needs to give a presentation, needs to complete a certain job, or cannot immediately plug in a charging power supply 47 to an AC wall adapter 49, the user can prompt the BIOS to delay execution of the discharge cycle until which time the user is ready.

Once the computer user enables the discharge cycle 30 on the power control menu 22, and a charging power supply such as an AC adaptor 49 is connected to the computer microcontroller 16, K_Discharge signal 38 will then be asserted. K_Discharge signal 38 turns off AC wall adapter 49 which allows battery pack 46 to discharge until battery 46 is equal to or less than very low voltage. Very low voltage is defined in the charge gauge integrated circuit 18 and is equal to EDV1 stored in FLGS register 17.

A portable device's rechargeable battery pack 46 typically comprises a plurality of batteries. To meet space and power requirements, the batteries in the battery pack are arranged in cells. Each cell contains a battery that is serially connected. In the preferred embodiment, the battery pack consists of two serial cells 46a and 46b, each cell containing, for example, seven NICAD batteries. Battery pack 46 also includes a sense resistor 46c coupled between the negative terminal of the cells and ground. Battery pack 46 sends VCC and GND (power supplies) to circuit 18 as well as Sense signal indicative of the current charge stored within the battery pack. Furthermore, a thermocouple or thermistor 45 is thermally connected to battery pack 46 and sends electrical signals, Tmp, indicative of the current temperature of the cells. The very low voltage value may be set at 1.0 volt per cell. When the battery pack discharges to 1.0 volt/cell, charge gauge integrated circuit 18 will drive the VLB signal to the BIOS and set the very low voltage flag (EDV1) within FLGS register 17. The BIOS will then command a display of the request to discharge message 30 in power menu 22 and beep the speaker. If the user selects "yes" to enable discharge cycle, then the BIOS will write logic one to PMC register 21 causing microcontroller 16 to drive K_Discharge. After completion of the discharge cycle, microcontroller 16 senses FLGS bit=logic 1, and therefore, resets K_Discharge to become disable and the power supply 47 will recharge the battery pack via AC wall adapter 49.

Figure 6A:
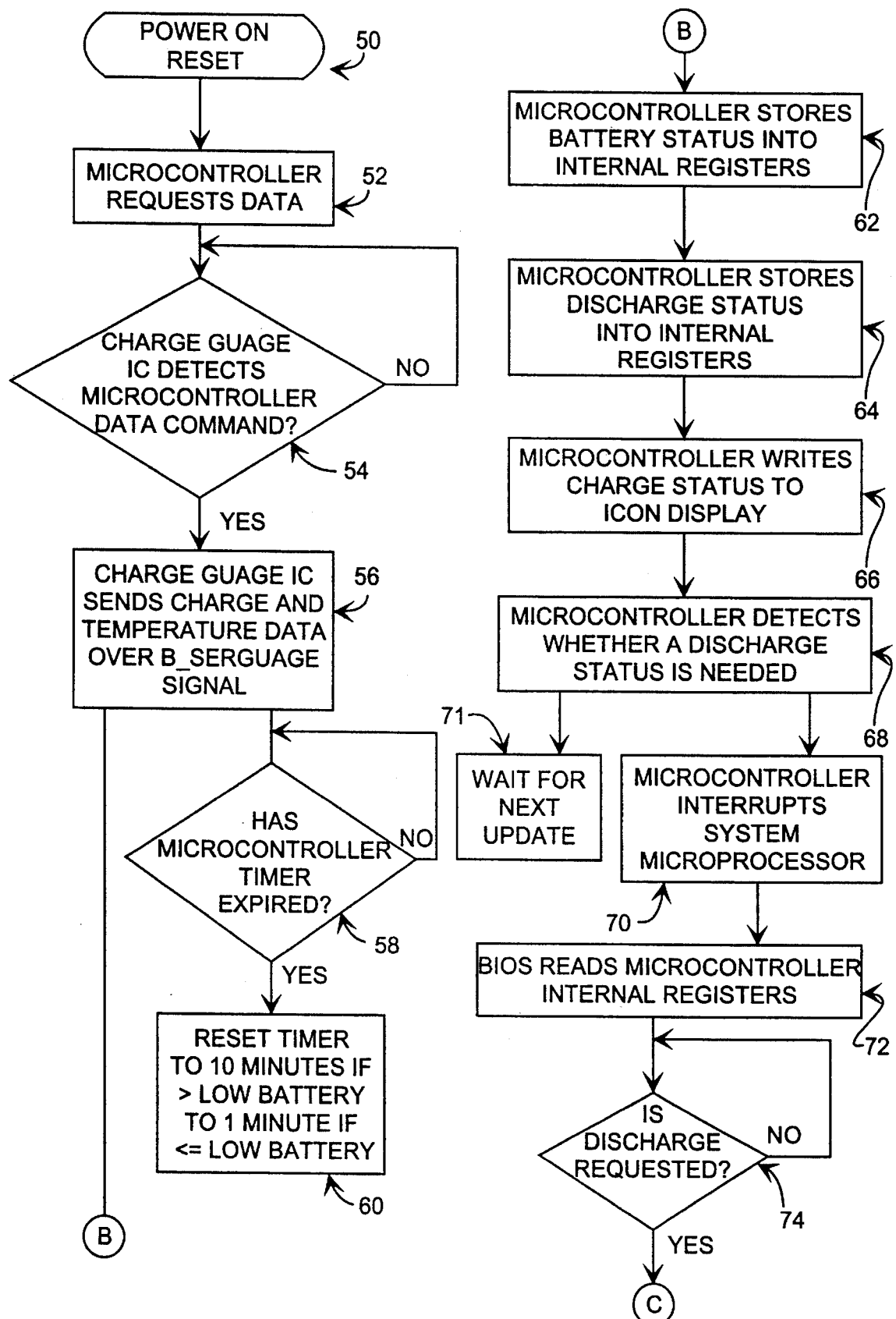
FIGS. 6a, 6b and 6c are flowcharts that depict one technique for controlling and monitoring a rechargeable battery pack according to the present invention.
Figure 6B:
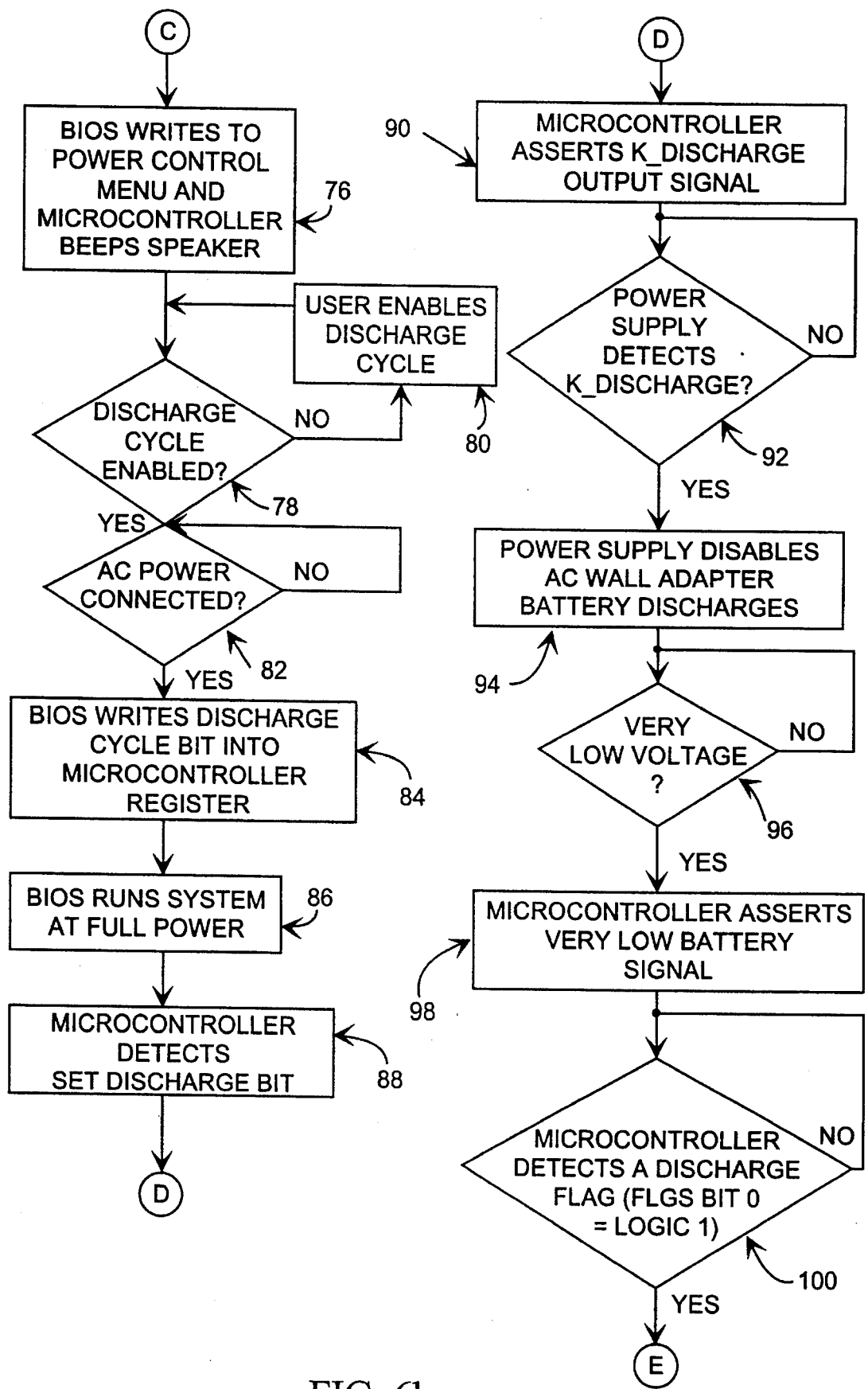
Figure 6C:
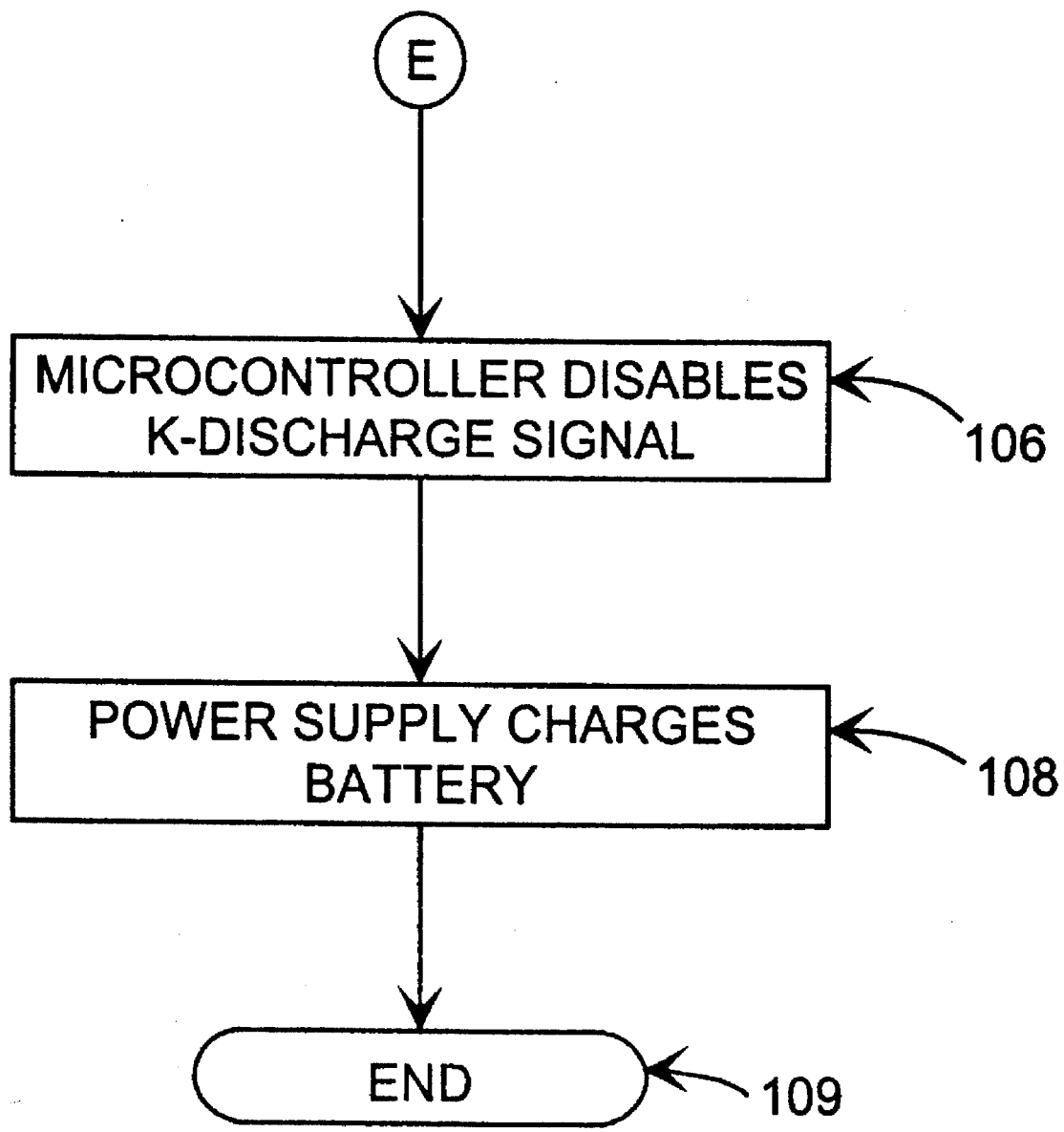

FIGS. 6a–6c illustrate a flowchart of one method for implementing programmable battery controller or charge gauge software. Associated software can be implemented in microcode and/or high level code, e.g., C-language. The flowchart shows how the microcontroller and system microprocessor interact to control and monitor battery charge status, temperature and discharge cycles. In step 50, the computer is powered on or reset. In steps 52 through 56, the microcontroller executes its own program to monitor the battery. The microcontroller sends the commands to read the status flags and the battery data from the charge gauge integrated circuit, as shown in step 54. The charge gauge integrated circuit returns signals representing battery charge level, temperature level, and status flags to the microcontroller. In step 58 through 60 the microcontroller times the duration until the next battery status update. If the battery charge level is greater than the low battery setting, the timer waits one minute until the next update. If the battery charge level is less than or equal to the low battery setting, then the timer waits for 0.5 minute until the next update.

In steps 62 and 64 the microcontroller stores the battery data values in the microcontroller's internal registers. In step 66 the microcontroller updates the battery charge level on the icon display. In another preferred embodiment, the microcontroller could compare the updated battery charge level with the previous battery charge level and only write to the icon display when the battery charge level changes.

In step 68 the microcontroller checks the discharge flag received from the charge gauge integrated circuit. If a discharge cycle is not necessary, the microcontroller continues to update battery status. If a discharge cycle is necessary, the microcontroller proceeds to step 70, otherwise the microcontroller proceeds to step 71. In step 70 the microcontroller interrupts the system BIOS to request a discharge cycle.

In steps 72 through 86 the system BIOS routines control when the discharge cycle is executed or begun. The BIOS, which runs on the system microprocessor, communicates information to the computer user. In step 72 the BIOS reads the internal registers from the microcontroller and checks in step 74 whether the discharge flag is asserted. In step 76 the BIOS writes the power control menu and warns the computer user with an audio beep that a discharge cycle is recommended. In step 78 the BIOS checks the power control menu to determine whether the computer user has enabled a discharge cycle. Then the BIOS will wait until the computer user enables the discharge cycle option, as shown in step 80.

Once the computer user enables the discharge cycle option, the BIOS will check that a power charger is connected to the computer in step 82. If a power charger is connected, The BIOS will then continue to step 84 where it will set the K_Discharge signal by writing to an internal register on the microcontroller. In step 86 the BIOS runs the system at maximum speed to quickly discharge the battery.

The microcontroller executes the discharge cycle in steps 88 through 98. In step 88 the microcontroller detects that the BIOS enables the discharge cycle by writing a logic one to DISCHG bit 0 of PMC register 21. The microcontroller correspondingly asserts its K_Discharge output signal in step 90. The K_Discharge signal is detected by the Power supply in step 92, and disables the battery charger in step 94. In steps 96 and 98, the charge gauge integrated circuit monitors the battery and asserts the very low voltage flag when the battery voltage equals or falls below the chosen 1.0 volt per cell threshold (e.g., bit one of FLGS register 17).

In step 100 the microcontroller detects FLGS bit 1=logic 1 and signals completion of the discharge cycle by writing to an internal register on the microcontroller PMC register bit 0 to logic 0. In step 106 the microcontroller correspondingly disables its K_Discharge signal. Once the K_Discharge signal is no longer asserted, the Power supply enables the battery charger in step 108 to recharge the batteries to an ending step shown by reference numeral 109.

Figure 7:
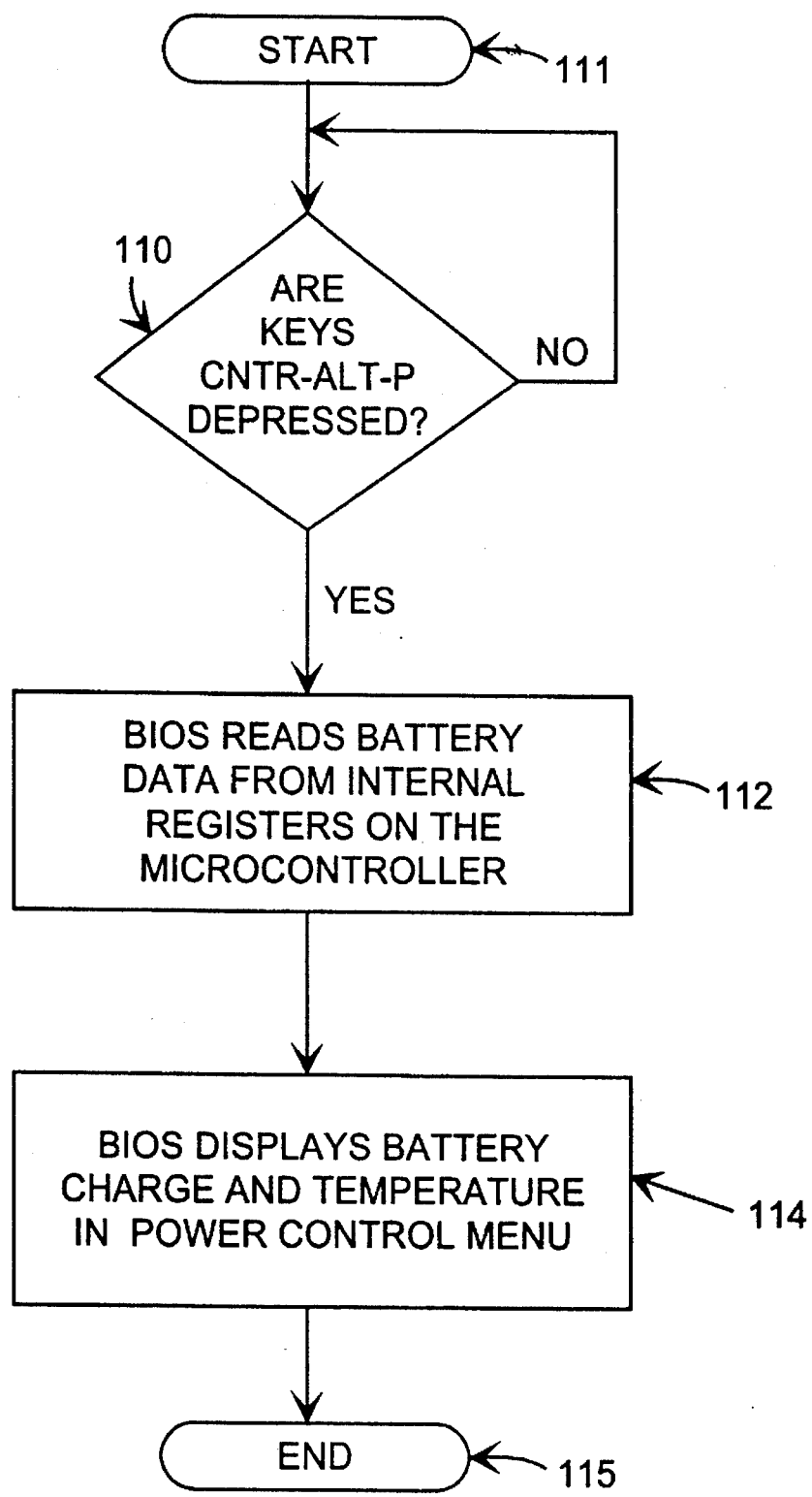
FIG. 7 flowchart that depicts one technique for controlling the power control menu according to the present invention.

FIG. 7 shows a flowchart of the power control menu software. The BIOS runs on the system microprocessor and generates the power control menu software. The BIOS also communicates with microcontroller 10 via read cycles of host system 10 to obtain the battery status information and displays the information in power control menu 22.

After starting step 111 is initiated, the computer requests in step 110 the battery status information when the user, for example, presses the Ctrl-Alt-P keys on the computer keyboard. The BIOS then reads the battery status information from the internal registers on the microcontroller PMC register 21 in step 112. The power control menu then displays the battery charge, the battery temperature, and the user defined settings in step 114 to an ending step shown by reference numeral 115.

It is to be understood that the form of the invention shown and described is to be taken as an exemplary preferred embodiment. Furthermore, it will be appreciated by those skilled in the art having the benefit of the foregoing disclosure and description that this invention is capable of variations in the size, shape, materials, components, circuit elements, wiring connections, and software without departing from the spirit of the invention.

What is claimed is:

1. A programmable battery controller comprising:
a rechargeable battery pack capable of discharging to a variable charge level;
a charge gauge circuit coupled to said battery, said charge gauge circuit having an internal register adapted to receive said variable charge level of said rechargeable battery;

a microcontroller having an internal register and a bidirectional bus coupled to said charge gauge and adapted to programmably retrieve and store said charge level;

an icon display coupled to said microcontroller and adapted to display said charge level from said internal register upon user command;

a microprocessor coupled to said microcontroller;

a keyboard gate array coupled to said microcontroller and said microprocessor;

a computer display coupled to said microprocessor, wherein said display includes a plurality of battery monitor parameters;

means for setting selected ones of said battery monitor parameters in response to input upon said keyboard gate array; and means for increasing and decreasing said charge level of said rechargeable battery in accordance with said battery monitor parameter settings.

2. The battery controller as recited in claim 1, wherein said battery monitor parameters comprise a plurality of settings displayed upon said monitor and which can be changed in response to an amount of discharge acceptable by said battery pack.

3. The battery controller as recited in claim 1, wherein said battery monitor parameters comprise low battery level setting, discharge cycle permitted, and low battery audio warning signals stored within said microprocessor and programmably transmitted to said charge gauge circuit.

4. The battery controller as recited in claim 1, wherein said computer display comprises means for receiving said charge level from the internal registers of said microcontroller.

5. The battery controller as recited in claim 1, wherein said increasing means comprises an ac power supply connectable to said battery pack.

6. The battery controller as recited in claim 1, wherein said decreasing means comprises a discharge flag sent from said charge gauge circuit to said microcontroller, wherein said discharge flag temporary interrupts said microprocessor and, depending upon said battery monitor parameters, said microprocessor initiates a discharge cycle until said microcontroller asserts a very low battery signal.

7. A programmable battery controller comprising:

a rechargeable battery pack capable of operating at a variable temperature and discharging to a variable charge level;

a charge gauge circuit coupled to said battery, said charge gauge circuit having an internal register adapted to receive said variable charge level and said variable temperature of said battery pack;

a microcontroller having an internal register and a bidirectional bus coupled to said charge gauge and adapted to programmably retrieve and store said temperature and said charge level;

an icon display coupled to said microcontroller and adapted to display said temperature and said charge level from said internal register;

a microprocessor coupled to said microcontroller;

a keyboard gate array coupled to said microcontroller and said microprocessor;

a computer display coupled to said microprocessor, wherein said display includes a plurality of battery monitoring parameters;

means for setting selected ones of said battery monitor parameters in response to input upon said keyboard gate array; and means for increasing and decreasing said charge level of said rechargeable battery in accordance with said battery monitor parameter settings.

8. The battery controller as recited in claim 7, wherein said battery monitor parameters comprise a plurality of settings displayed upon said monitor and which can be changed in response to an amount of discharge acceptable by said battery pack.

9. The battery controller as recited in claim 7, wherein said battery monitor parameters comprise low battery level setting, discharge cycle permitted, and low battery audio warning signals stored within said microprocessor and programmably transmitted to said charge gauge circuit.

10. The battery controller as recited in claim 7, wherein said computer display comprises means for receiving said charge level from the internal registers of said microcontroller.

11. The battery controller as recited in claim 7, wherein said increasing means comprises an ac power supply connectable to said battery pack.

12. The battery controller as recited in claim 7, wherein said decreasing means comprises a discharge flag sent from said charge gauge circuit to said microcontroller, wherein said discharge flag temporary interrupts said microprocessor and, depending upon said battery monitor parameters, said microprocessor initiates a discharge cycle until said microcontroller detects a very low battery signal.

13. A method for controlling a battery comprising the steps of:

providing a rechargeable battery operating at a variable temperature and charge level;

manipulating a computer display to set parameters for controlling said battery;

acquiring periodic temperature and charge level for said battery;

displaying said temperature and charge level upon said computer display; and discharging said battery at programmable intervals depending upon the parameters set upon said computer display.

14. The method as recited in claim 13, wherein said discharging step comprises:

providing a charge gauge circuit having a sense resistor and a thermistor connected to said battery;

providing a microcontroller having an internal register connected to said charge gauge circuit;

providing a microprocessor connected to said microcontroller;

producing a discharge flag from said sense resistor;

sending said discharge flag from said charge gauge circuit to said microcontroller;

interrupting said microprocessor depending upon the setting of said battery discharge parameters; and initiating a discharge cycle for a period of time until said charge gauge circuit asserts a very low battery signal to said sense resistor.

* * * * *